United States Patent
Cecchi et al.

(10) Patent No.: US 6,989,709 B2
(45) Date of Patent: Jan. 24, 2006

(54) CMOS LOW VOLTAGE HIGH-SPEED DIFFERENTIAL AMPLIFIER

(75) Inventors: Delbert Raymond Cecchi, Rochester, MN (US); Charles C. Hansen, Kenyon, MN (US); Curtis Walter Preuss, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 284 days.

(21) Appl. No.: 09/903,239

(22) Filed: Jul. 11, 2001

(65) Prior Publication Data

US 2003/0011432 A1    Jan. 16, 2003

(51) Int. Cl.
*G06G 7/26*    (2006.01)

(52) U.S. Cl. .................. 327/563; 327/65; 330/258; 330/261

(58) Field of Classification Search ........ 327/560–563, 327/538, 65, 67; 330/253, 258, 261
See application file for complete search history.

(56) References Cited

U.S. PATENT DOCUMENTS

| | | | | |
|---|---|---|---|---|
| 4,958,133 A | * | 9/1990 | Bazes | 330/253 |
| 5,039,873 A | * | 8/1991 | Sasaki | 327/538 |
| 5,703,532 A | * | 12/1997 | Shin et al. | 330/253 |
| 6,313,696 B1 | * | 11/2001 | Zhang | 327/563 |
| 6,429,685 B1 | * | 8/2002 | Stockstad | 326/83 |

* cited by examiner

*Primary Examiner*—Long Nguyen
(74) *Attorney, Agent, or Firm*—Bockhop & Associates LLC

(57) ABSTRACT

A differential amplifier for providing common-mode rejection while providing differential-mode amplification includes an active differential amplification element electrically coupled to a first input signal, a second input signal and an output signal. The active differential amplification element is also electrically coupled to a first voltage and to a different second voltage. A passive bias element is electrically coupled to the active differential amplification element. The passive bias element is capable of biasing the active differential amplification element so that the active differential amplification element operates in a saturation mode. The active differential amplification element thereby generates the output signal so that the output signal corresponds to a voltage difference between the first input signal and the second input signal.

10 Claims, 2 Drawing Sheets

CMOS LOW VOLTAGE HIGH-SPEED DIFFERENTIAL AMPLIFIER

BACKGROUND OF THE INVENTION

1. Field of the Invention

The present invention relates to electronic circuits and, more specifically, to a CMOS differential amplifier that reduces the speed-limiting effects of capacitance, as well as reducing the required level of the supply voltage.

2. Description of the Prior Art

Differential amplifiers sense two input signals and output a signal that is a function of the difference in values of the two input signals. One type of differential amplifier employs complementary metal-oxide semiconductor (CMOS) integrated circuits. CMOS differential amplifiers are used for various applications because a number of advantages can be derived from these types of amplifiers, as compared to single-ended amplifiers. Differential amplifiers are used to amplify analog, as well as digital signals, and can be used in various implementations to provide an output from the amplifier in response to differential inputs. They can be readily adapted to function as an operational amplifier, a comparator, a sense amplifier and as a front-end buffer stage for another circuit. Differential amplifiers are used where linear amplification having a minimum of distortion is desired.

However, a typical differential amplifier will operate only over a relatively narrow range of common-mode input voltages. As the amplifier is forced to extend beyond this small range of common-mode voltages, the differential-mode gain drops off sharply and in some instances drops to zero.

One technique for improving the range of this common-mode input voltage range is described in U.S. Pat. No. 4,958,133, issued to Bazes, which discloses complementary pairs of transistors that are symmetrically configured. Corresponding symmetrical transistors are matched to have the same characteristics. Because of the biasing scheme, negative feedback is provided internally within the amplifier to provide the low sensitivity to variations. A strong common-mode rejection is provided because of the self-biasing scheme, in order to provide an extended range of common-mode input voltages, but at the same time providing a high gain in differential-mode amplification. Certain transistors employed in a device according to the Bazes patent exhibit capacitance, which limits the response speed of the amplifier.

Therefore, there is a need for a differential amplifier that reduces speed-limiting effects of capacitance.

SUMMARY OF THE INVENTION

The disadvantages of the prior art are overcome by the present invention which, in one aspect, is a self-biasing differential amplifier that employs passive elements (such as resistors) rather than active elements (such as transistors) to bias the amplification elements so that the amplification elements operate in saturation mode.

The passive biasing elements, which exhibit less capacitance than the corresponding active elements, reduce the response time associated with the differential amplifier.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
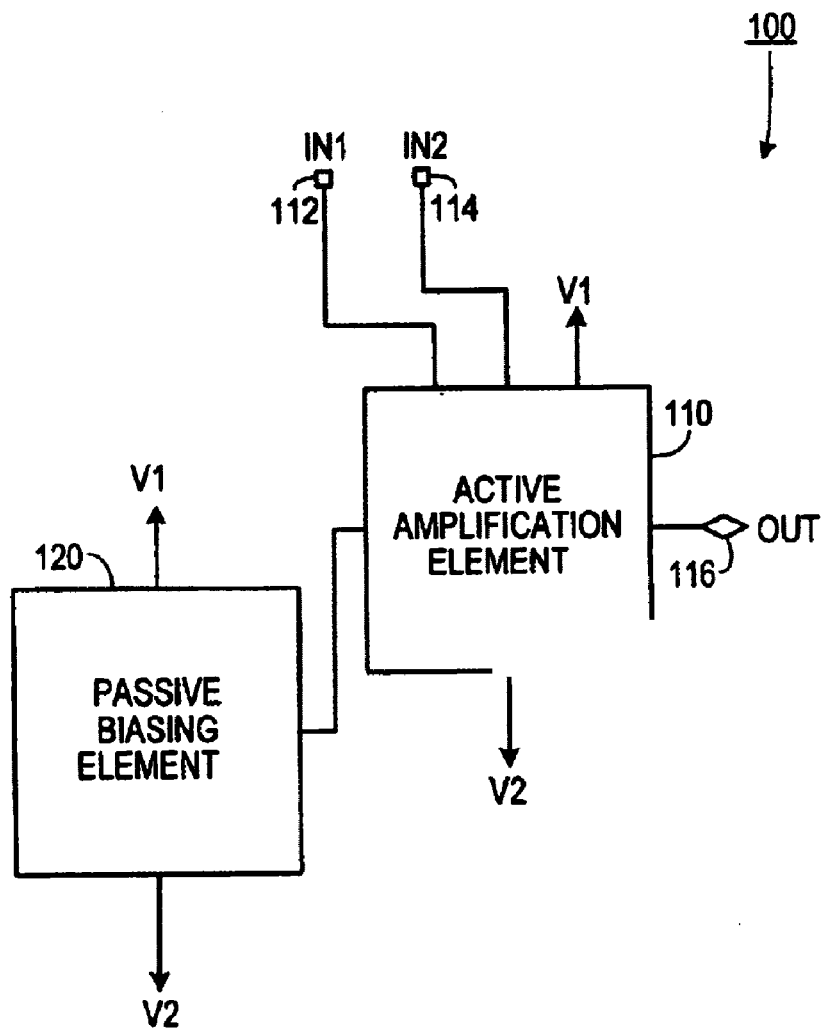
FIG. 1 is a block diagram of one embodiment of the invention.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

As shown in FIG. 1, one embodiment of the invention is a differential amplifier 100 for providing common-mode rejection while providing differential-mode amplification. The differential amplifier 100 includes an active differential amplification element 110 and a passive bias element 120. The active differential amplification element 110 is electrically coupled to a first input signal 112, a second input signal 114 and an output signal 116. It is also electrically coupled to a first voltage V1 and a different second voltage V2. Typically, the second voltage V2 is a common ground. The passive bias element 120 is electrically coupled to the active differential amplification element 110 and is capable of biasing the active differential amplification element 110 so that the active differential amplification element 110 operates in a saturation mode and generates the output signal 116 so that the output signal 116 corresponds to a voltage difference between the first input signal 112 and the second input signal 114.

Figure 2:
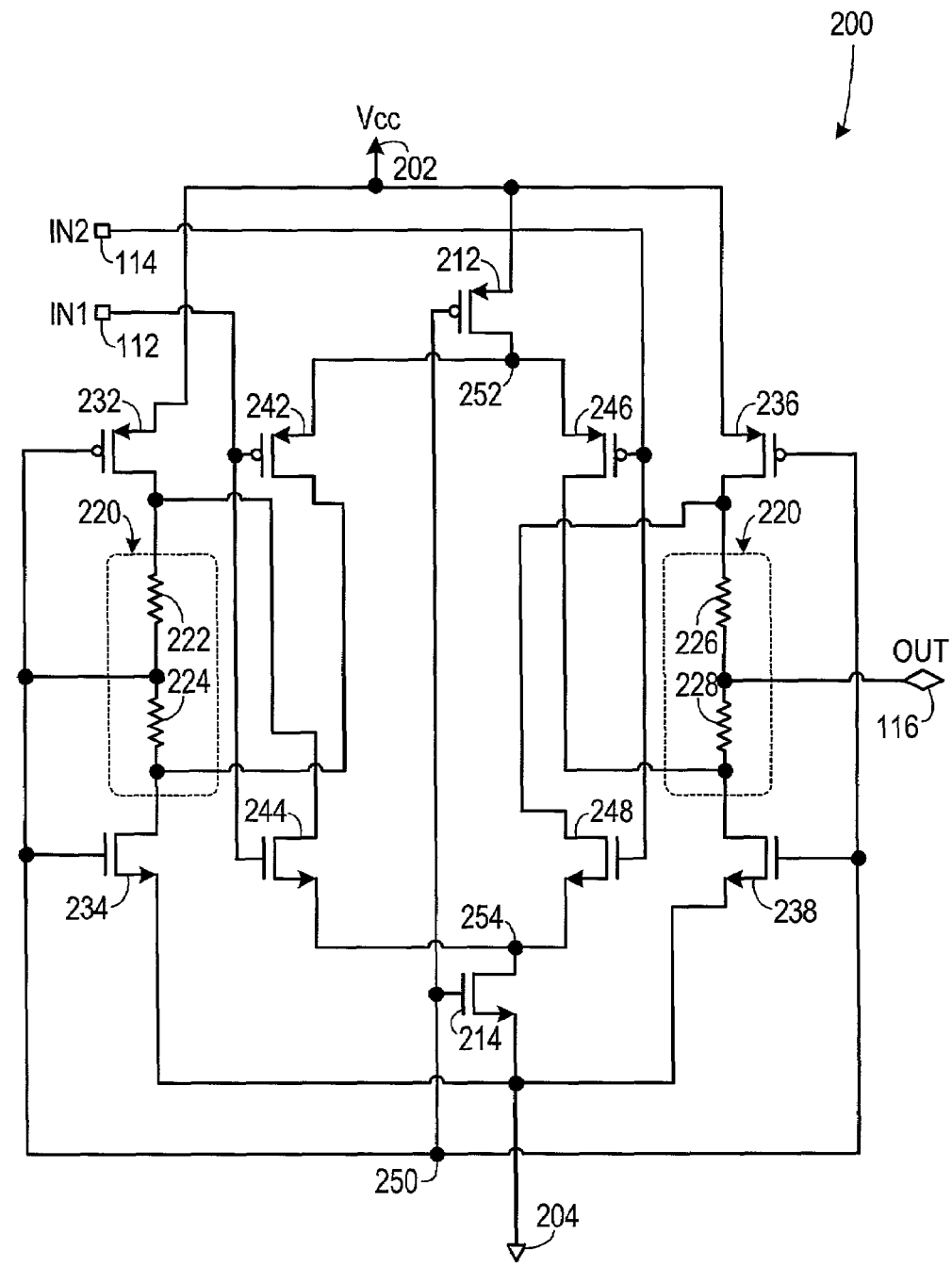
FIG. 2 is a schematic diagram of one illustrative embodiment of the invention.

As shown in FIG. 2, the differential amplification element may be embodied as an amplifier circuit 200 that includes a first transistor 232 that has a first source electrically coupled to the first voltage 202, a first gate electrically coupled to a first node 250 and a first drain. Node 250 is a bias node. The circuit 200 also includes a second transistor 234 that has a second drain, a second gate electrically coupled to the first node 250 and a second source electrically coupled to the second voltage 204. A third transistor 236 has a third source electrically coupled to the first voltage 202, a third drain and a third gate electrically coupled to the first node 250. A fourth transistor 238 has a fourth drain, a fourth gate electrically coupled to the first node 250 and a fourth source electrically coupled to the second voltage 204. A fifth transistor 212 has a fifth source electrically coupled to the first voltage 202, a fifth drain electrically coupled to a second node 252 and a fifth gate electrically coupled to the first node 250. A sixth transistor 214 has a sixth drain electrically coupled to a third node 254, a sixth gate electrically coupled to the first node 250 and a sixth source electrically coupled to the second voltage 204. A seventh transistor 242 has a seventh source electrically coupled to the second node 252, a seventh drain electrically coupled to the second drain, and a seventh gate electrically coupled to a first input signal 112. An eighth transistor 244 has an eighth drain electrically coupled to the first drain, and an eighth source electrically coupled to the third node 254 and an eighth gate electrically coupled to the first input signal 112. A ninth transistor 246 has a ninth source electrically coupled to the second node 252, a ninth gate electrically coupled to a second input signal 114 and a ninth drain electrically coupled to the fourth drain. A tenth transistor 248 has a tenth drain electrically coupled to the third drain, a tenth gate electrically coupled to the second input signal 114 and a tenth source electrically coupled to the third node 254. The passive bias element 220 includes: a first resistor 222 electrically coupling the first drain to the first node 250, a second resistor 224 electrically coupling the second drain to the first node 250, a third resistor 226 electrically coupling the third drain to an output signal 116 and a fourth resistor 228 electrically coupling the fourth drain to the output signal 116.

In this embodiment, the first transistor 232, the third transistor 236, the fifth transistor 212, the seventh transistor 242 and the ninth transistor 246 are p-channel devices, whereas the second transistor 234, the fourth transistor 238, the sixth transistor 214, the eighth transistor 244 and the tenth transistor 248 are n-channel devices. As would be clear to one of ordinary skill in the art, other types of transistors, or other electronic amplification elements, would be freely interchangeable with the devices shown in FIG. 2.

In a single chip embodiment, the resistors 222, 224, 226 and 228 may be formed in a polysilicon layer, as is generally known in the art. Such resistors have approximately one tenth the capacitance of a transistor gate of similar size. Other process methods can be used to form resistors on the chip and yield similar results The above described embodiments are given as illustrative examples only. It will be readily appreciated that many deviations may be made from the specific embodiments disclosed in this specification without departing from the invention. Accordingly, the scope of the invention is to be determined by the claims below rather than being limited to the specifically described embodiments above.

What is claimed is:

1. A differential amplifier for providing common-mode rejection while providing differential-mode amplification, comprising:
   a. an active differential amplification element electrically coupled to a first input signal, a second input signal and an output signal, the active differential amplification element also electrically coupled to a first voltage and a different second voltage; and
   b. a passive bias element, electrically coupled to the active differential amplification element, the passive bias element capable of biasing the active differential amplification element so that the active differential amplification element operates in a saturation mode, thereby generating the output signal so that the output signal corresponds to a voltage difference between the first input signal and the second input signal.

2. The differential amplifier of claim 1, wherein the active differential amplification element comprises:
   a. a first transistor having a first source electrically coupled to the first voltage, a first gate electrically coupled to a first node and a first drain, the first node being a bias node;
   b. a second transistor having a second drain, a second gate electrically coupled to the first node and a second source electrically coupled to the second voltage different from the first voltage;
   c. a third transistor having a third source electrically coupled to the first voltage, a third drain and a third gate electrically coupled to the first node;
   d. a fourth transistor having a fourth drain, a fourth gate electrically coupled to the first node and a fourth source electrically coupled to the second voltage;
   e. a fifth transistor having a fifth source electrically coupled to the first voltage, a fifth drain electrically coupled to a second node and a fifth gate electrically coupled to the first node;
   a sixth transistor having a sixth drain electrically coupled to a third node, a sixth gate electrically coupled to the first node and a sixth source electrically coupled to the second voltage;
   g. a seventh transistor having a seventh source electrically coupled to the second node, a seventh drain electrically coupled to the second drain, and a seventh gate electrically coupled to a first input signal;
   h. an eighth transistor having an eighth drain electrically coupled to the first drain, an eighth source electrically coupled to the third node and an eighth gate electrically coupled to the first input signal;
   i. a ninth transistor having a ninth source electrically coupled to the second node, a ninth gate electrically coupled to a second input signal and a ninth drain electrically coupled to the fourth drain; and
   j. a tenth transistor having a tenth drain electrically coupled to the third drain, a tenth gate electrically coupled to the second input signal and a tenth source electrically coupled to the third node.

3. The differential amplifier of claim 2, wherein the passive bias element comprises:
   a. a first resistor electrically coupling the first drain to the first node;
   b. a second resistor electrically coupling the second drain to the first node;
   c. a third resistor electrically coupling the third drain to the output signal; and
   d. a fourth resistor electrically coupling the fourth drain to the output signal.

4. The differential amplifier of claim 1, wherein the first transistor, the third transistor, the fifth transistor, the seventh transistor and the ninth transistor each comprise a p-channel device.

5. The differential amplifier of claim 1, wherein the second transistor, the fourth transistor, the sixth transistor, the eighth transistor and the tenth transistor each comprise an n-channel device.

6. The differential amplifier of claim 1, wherein the second voltage is electrically coupled to a common ground.

7. A differential amplifier for providing common-mode rejection while providing differential-mode amplification, comprising:
   a. a first transistor having a first source electrically coupled to a first voltage, a first gate electrically coupled to a first node and a first drain, the first node being a bias node;
   b. a second transistor having a second drain, a second gate electrically coupled to the first node and a second source electrically coupled to a second voltage different from the first voltage;
   c. a first resistor electrically coupling the first drain to the first node;
   d. a second resistor electrically coupling the second drain to the first node;
   e. a third transistor having a third source electrically coupled to the first voltage, a third drain and a third gate electrically coupled to the first node;

f. a fourth transistor having a fourth drain, a fourth gate electrically coupled to the first node and a fourth source electrically coupled to the second voltage;
g. a third resistor electrically coupling the third drain to an output signal;
h. a fourth resistor electrically coupling the fourth drain to the output signal;
i. a fifth transistor having a fifth source electrically coupled to the first voltage, a fifth drain electrically coupled, to a second, node and a fifth gate electrically coupled to the first node;
j. a sixth transistor having a sixth drain electrically coupled to a third node, a sixth gate electrically coupled to the first node and a sixth source electrically coupled to the second voltage;
k. a seventh transistor having a seventh source electrically coupled to the second node, a seventh drain electrically coupled to the second drain, and a seventh gate electrically coupled to a first input signal;
l. an eighth transistor having an eighth drain electrically coupled to the first drain, and an eighth source electrically coupled to the third node and an eighth gate electrically coupled to the first input signal;
m. a ninth transistor having a ninth source electrically coupled to the second node, a ninth gate electrically coupled to a second input signal and a ninth drain electrically coupled to the fourth drain; and
n. a tenth transistor having a tenth drain electrically coupled to the third drain, a tenth gate electrically coupled to the second input signal and a tenth source electrically coupled to the third node.

8. The differential amplifier of claim 7, wherein the first transistor, the third transistor, the fifth transistor, the seventh transistor and the ninth transistor each comprise a p-channel device.

9. The differential amplifier of claim 7, wherein the second transistor, the fourth transistor, the sixth transistor, the eighth transistor and the tenth transistor each comprise an n-channel device.

10. The differential amplifier of claim 7, wherein the second voltage is electrically coupled to a common ground.

* * * * *

UNITED STATES PATENT AND TRADEMARK OFFICE
CERTIFICATE OF CORRECTION

PATENT NO. : 6,989,709 B2  
APPLICATION NO. : 09/903239  
DATED : January 24, 2006  
INVENTOR(S) : Delbert Raymond Cecchi, Charles C. Hanson and Curtis Walter Preuss It is certified that error appears in the above-identified patent and that said Letters Patent is hereby corrected as shown below:

(75)Col. 1, Inventors: "Charles C. Hansen" should be --Charles C. Hanson--.

Signed and Sealed this

Twenty-ninth Day of August, 2006

JON W. DUDAS  
*Director of the United States Patent and Trademark Office*